United States Patent
Hsu et al.

(10) Patent No.: US 10,475,925 B2
(45) Date of Patent: Nov. 12, 2019

(54) COMPLEMENTARY METAL OXIDE SEMICONDUCTOR DEVICE AND METHOD OF FORMING THE SAME

(71) Applicant: UNITED MICROELECTRONICS CORP., Hsin-Chu (TW)

(72) Inventors: Wei-Lun Hsu, Taichung (TW); Hsin-Che Huang, Tainan (TW); Shyan-Liang Chou, Tainan (TW); Hung-Lin Shih, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/985,683

(22) Filed: May 21, 2018

(65) Prior Publication Data

US 2018/0277679 A1    Sep. 27, 2018

Related U.S. Application Data

(62) Division of application No. 15/446,009, filed on Mar. 1, 2017, now Pat. No. 10,008,599.

(30) Foreign Application Priority Data

Jan. 23, 2017 (TW) .............................. 106102302 A (51) Int. Cl.
*H01L 21/762* (2006.01)
*H01L 29/78* (2006.01)
(Continued)

(52) U.S. Cl.
CPC .... *H01L 29/7846* (2013.01); *H01L 21/76224* (2013.01); *H01L 21/823878* (2013.01);
(Continued)

(58) Field of Classification Search
CPC .............. H01L 21/02; H01L 21/02164; H01L 21/0217; H01L 21/8238; H01L 21/76224;
(Continued)

(56) References Cited

U.S. PATENT DOCUMENTS

| 7,285,831 B2 | 10/2007 | Jung |
| 2003/0054616 A1* | 3/2003 | Endisch ............ H01L 21/02282 438/400 |

(Continued)

OTHER PUBLICATIONS

Tseng, Title of Invention: Semiconductor Structure and Method of Forming the Same, U.S. Appl. No. 15/250,924, filed Aug. 30, 2016.

*Primary Examiner* — Chuong A Luu
(74) *Attorney, Agent, or Firm* — Winston Hsu (57) ABSTRACT

A method for forming a complementary metal oxide semiconductor device is disclosed. First, a substrate having a first device region and a second device region is provided. A first trench is formed in the first device region and filled with a first material. A second trench is formed in the second device region and filled with a second material. The first material and the second material comprise different stresses. After that, a first gate structure and a second gate structure are formed on the first material and the second material and completely covering the first trench and the second trench, respectively.

6 Claims, 12 Drawing Sheets

(51) Int. Cl.
*H01L 27/092* (2006.01)
*H01L 29/06* (2006.01)
*H01L 21/8238* (2006.01)

(52) U.S. Cl.
CPC ........ *H01L 27/092* (2013.01); *H01L 29/0649* (2013.01); *H01L 29/785* (2013.01); *H01L 21/823807* (2013.01)

(58) Field of Classification Search
CPC ..... H01L 21/823864; H01L 21/823878; H01L 21/823857; H01L 21/823807; H01L 29/78; H01L 29/785; H01L 29/06; H01L 29/7846; H01L 29/0649; H01L 29/76; H01L 29/66; H01L 29/7831
USPC .......................................... 257/369; 438/199
See application file for complete search history.

(56) References Cited

U.S. PATENT DOCUMENTS

| | | | |
|---|---|---|---|
| 2012/0025319 | A1 | 2/2012 | Zhu |
| 2012/0171842 | A1* | 7/2012 | Zhu .................... H01L 21/3081 438/424 |
| 2015/0311341 | A1* | 10/2015 | Hur .................. H01L 21/02532 257/190 |
| 2015/0380519 | A1 | 12/2015 | Zhao |
| 2017/0012000 | A1 | 1/2017 | Tseng |
| 2017/0103986 | A1 | 4/2017 | Kim |

* cited by examiner

FIG. 14

COMPLEMENTARY METAL OXIDE SEMICONDUCTOR DEVICE AND METHOD OF FORMING THE SAME

CROSS REFERENCE TO RELATED APPLICATIONS

This is a division of U.S. application Ser. No. 15/446,009 filed Mar. 1, 2017. The above-mentioned applications are included in their entirety herein by reference.

BACKGROUND OF THE INVENTION

1. Field of the Invention

The present invention generally relates to a complementary metal oxide semiconductor (CMOS) device and a method of forming the same. More particularly, the present invention relates to a CMOS device comprising single diffusion break (SDB) structures having different stresses and a method of forming the same.

2. Description of the Prior Art

In advanced semiconductor technology, fin field effect transistors (Fin FET) have taken the place of traditional planar transistors and become the mainstream of development. Generally, at the beginning of forming fin FETs, trenches are formed in a semiconductor substrate by at least a patterning processes, such as a photolithograph-etching process (PEP) to transfer the layout pattern to the semiconductor substrate and a plurality of fin structures are defined in the semiconductor substrate by the trenches. The trenches are then filled with an insulating dielectric material to form an isolation structure between the fin structures. A fin recess process is performed to recess the insulating dielectric material to expose the top surface and the upper sidewall of the fin structures. Afterward, a gate process is performed to form the gate structures striding across the fin structures, wherein the overlapping regions of the fin structures and the gate structures are the channel regions of the fin FETs.

It is well-known in the art that stresses such as compressive stress and tensile stress may have influences on device performance. A certain type of stress is usually applied on the devices by forming, for example, strained silicon in the source/drain region, or forming stressor layers such as a spacer layer or a contact etching stop layer (CESL) comprising proper stress directly covering the gate structure. However, for a complementary metal oxide semiconductor (CMOS) device comprising devices having complementary conductivities, introducing a compressive stress may improve the performance of the P-type device, but may adversely decrease the performance of the N-type device. On the other hand, introducing a tensile stress may improve the performance of the N-type device, but may adversely decrease the performance of the P-type device.

In light of the above, there is still a need in the field to provide a novel CMOS device wherein different stresses may be introduced in different areas to respectively improve the performance of the devices according to their conductivities.

SUMMARY OF THE INVENTION

It is one objective of the present invention to provide a CMOS device and the manufacturing of forming the same, wherein single diffusion break (SDB) structures are made to comprise different stresses in different device regions to respectively improve the device performance according the conductivities thereof.

According to one aspect of the present invention, a CMOS device is provided. The CMOS device includes a substrate having a first device region and a second device region. A first isolation structure comprising a first trench filled with a first material is formed in the first device region, and a second isolation structure comprising a second trench filled with a second material is formed in the second device region. The first material and the second material comprise different stresses. A first gate structure is disposed atop the first material and completely covering the first trench. A second gate structure is disposed atop the second material and completely covering the second trench.

According to another aspect of the invention, a method for forming a CMOS device is provided. Firstly, a substrate having a first device region and a second device region is provided. A first trench is then formed in the first device region and a first material is formed filling the first trench; a second trench is formed in the second device region and a second material is formed filling the second trench. The first material and the second material comprise different stresses. A first gate structure and a second gate structure are formed atop the first material and the second material respectively, wherein the first gate structure completely covers the first trench and the second gate structure completely covers the second trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The above and other aspects and features of the present invention will become apparent by describing in detail exemplary embodiments thereof with reference to the attached drawings. Various structures shown in the drawings are not necessarily drawn to scale, and structural, logical, and electrical changes may be made in other embodiments without departing from the scope of the present invention.

In FIG. 1, FIG. 3 and FIG. 6, the upper portion is a top view, and the lower portion is a cross-sectional view taken along line A-A' in the top view.

In FIG. 9, FIG. 12 and FIG. 14, the upper portion is a top view, and the lower portion is a cross-sectional view taken along line A-A' in the top view.

DETAILED DESCRIPTION

To provide a better understanding of the present invention to those of ordinary skill in the art, several exemplary embodiments will be detailed as follows, with reference to the accompanying drawings using numbered elements to elaborate the contents and effects to be achieved.

Figure 1:
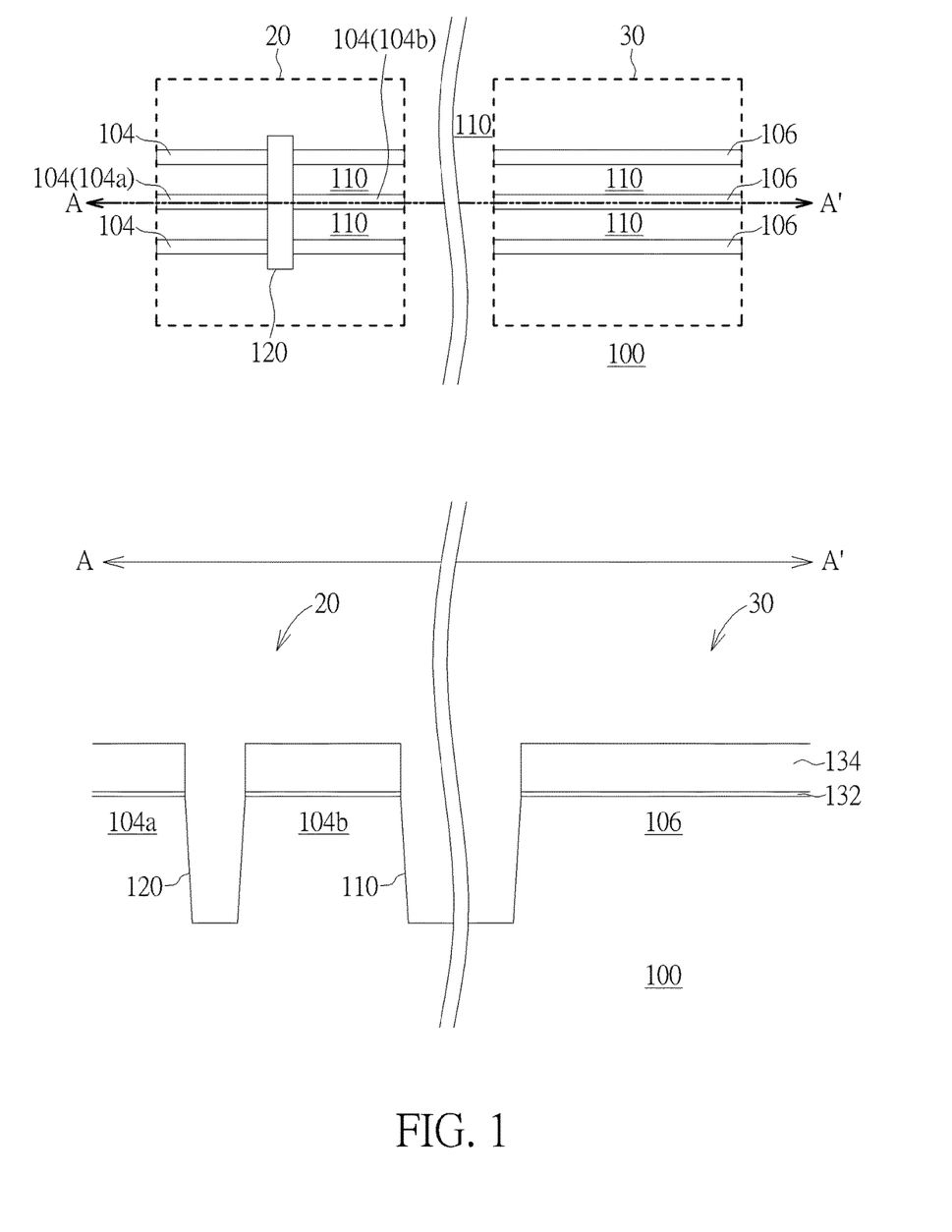
FIG. 1 to FIG. 6 are schematic diagrams illustrating the steps of fabricating a CMOS device according to a first embodiment of the present invention.
Figure 2:
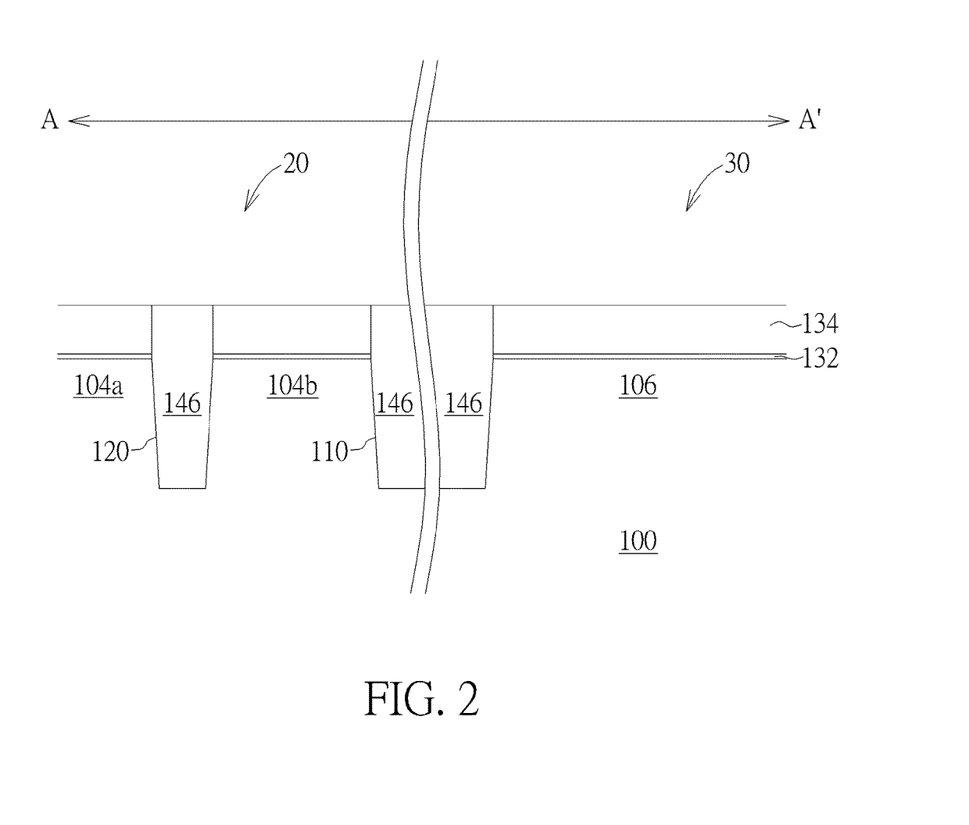
Figure 3:
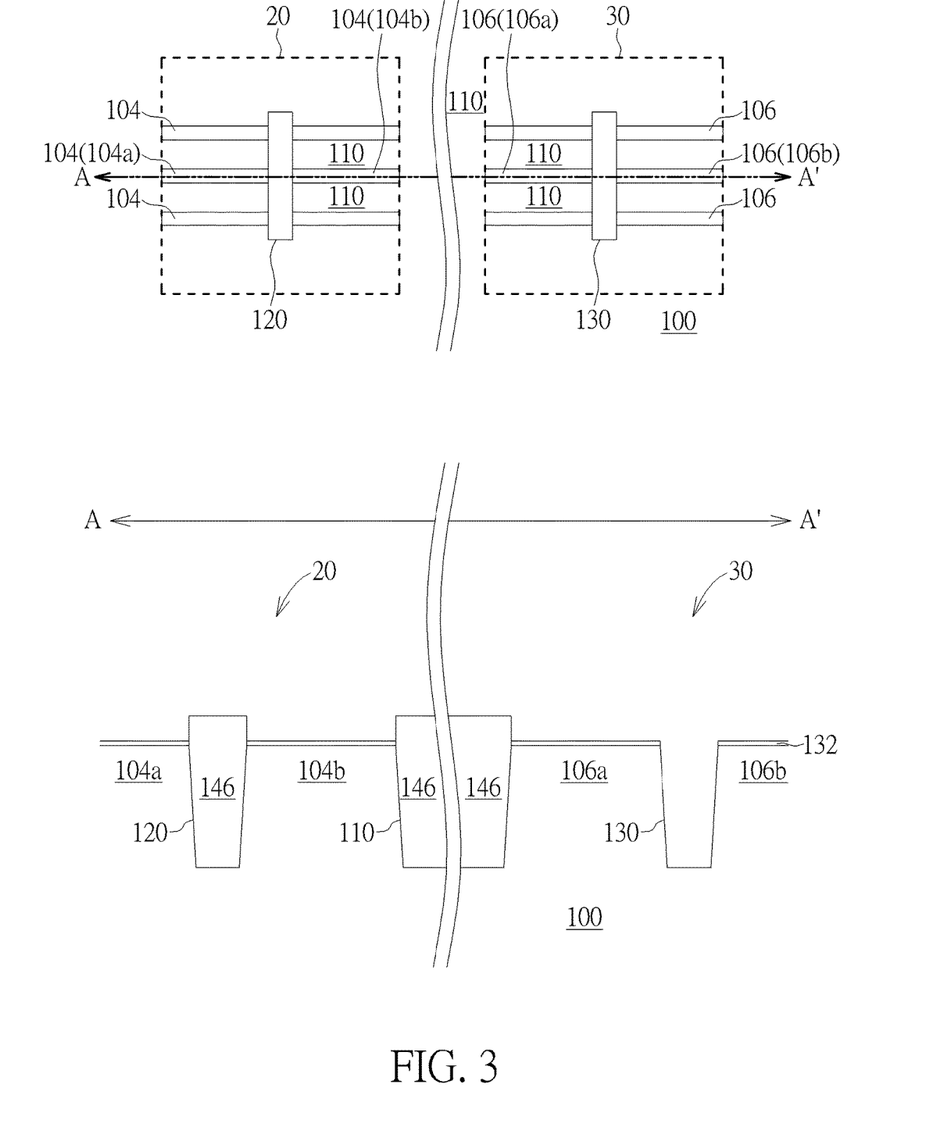
Figure 4:
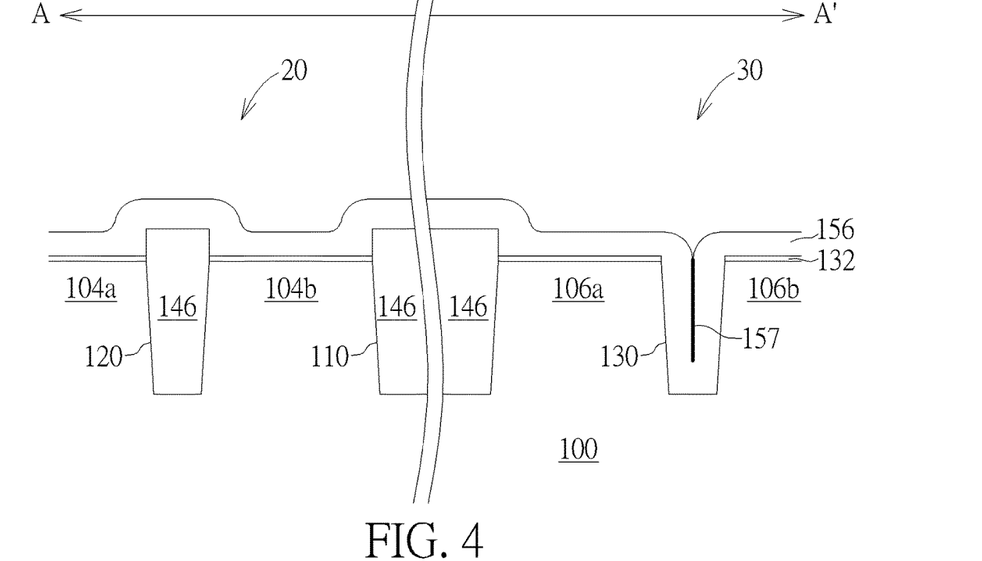
Figure 5:
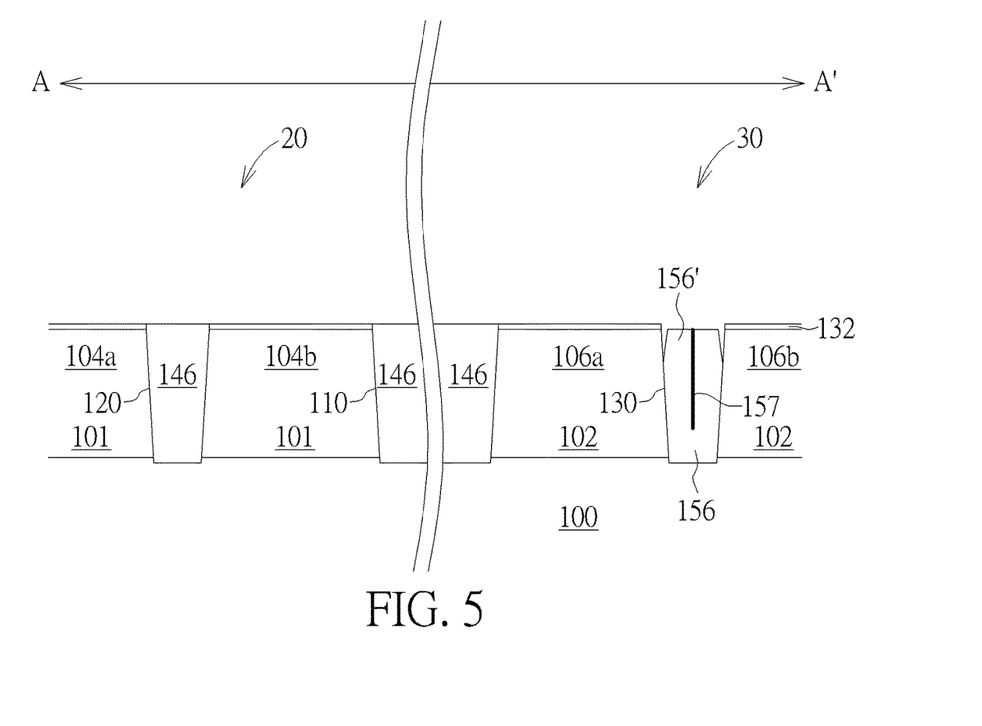
Figure 6:
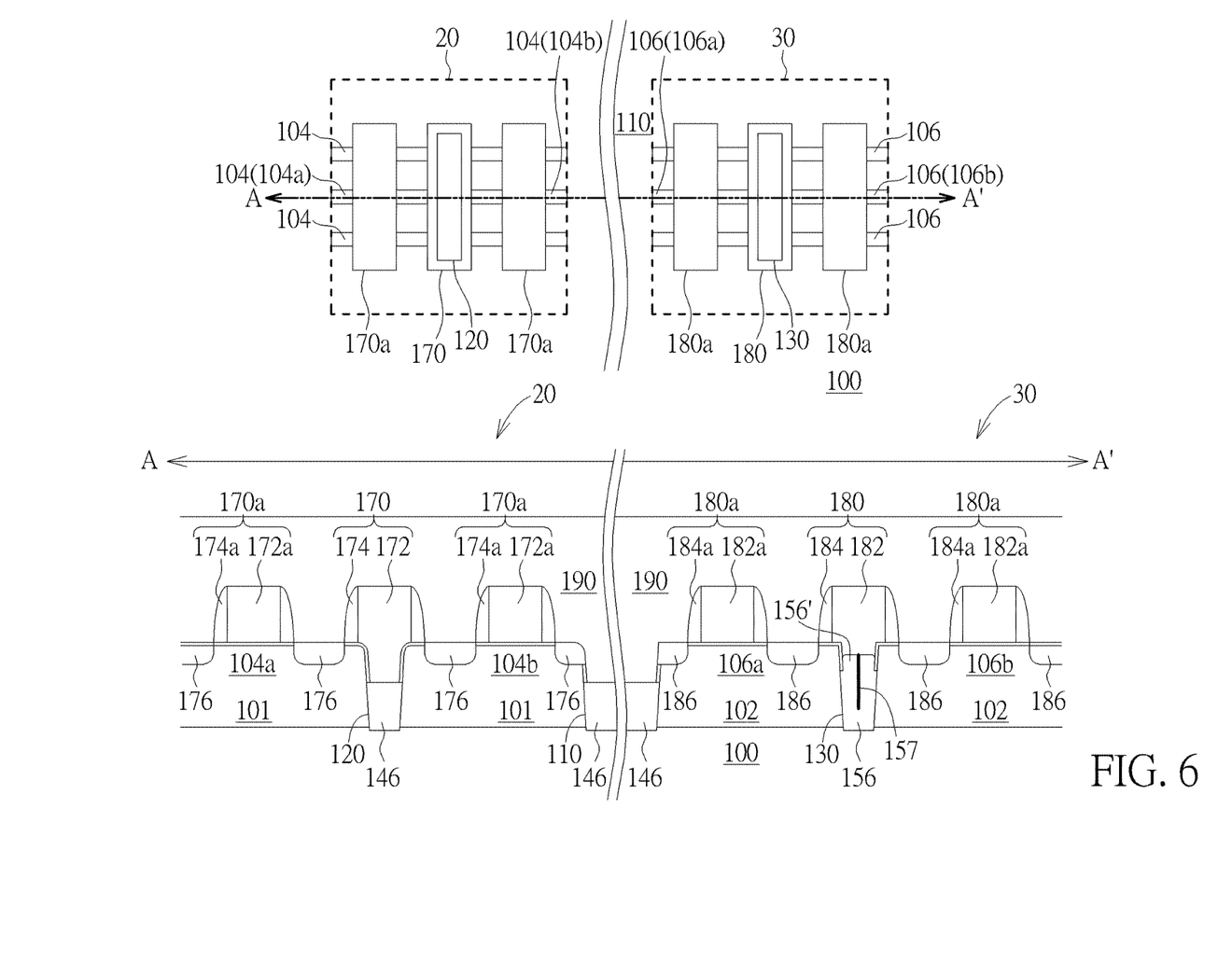

FIG. 1 to FIG. 6 are schematic diagrams illustrating the steps of fabricating a CMOS device according to a first embodiment of the present invention. In FIG. 1, FIG. 3 and FIG. 6, the upper portion is a top view, and the lower portion is a cross-sectional view taken along line A-A' in the top view. Some reference numbers referring to elements in the cross-sectional views are not shown in the top view for the sake of simplicity.

Please refer to FIG. 1. Firstly, a substrate 100 is provided. The substrate 100 may comprise silicon substrate, silicon-containing substrate or silicon-on-insulator (SOI) substrate, but not limited thereto. A pad layer 132 and a buffer layer 134 are formed on the substrate 100. A deep trench 110 is formed in the substrate 100 to define at least a first device region 20 and at least a second device region 30, wherein the first device region 20 comprises a plurality of parallel-arranged fin structures 104 defined by the deep trench 110, and the second device region 30 comprises a plurality of parallel-arranged fin structures 106 defined by the deep trench 110. According to the embodiment, devices having a first conductive type such as P-type would be formed in the first device region 20, and devices having a second conductive type such as N-type would be formed in the second device region 30. For ease of illustration and description, the first device region 20 and the second device region 30 are drawn adjacent to each other in FIG. 1 and the fin structure 104 and fin structure 106 are drawn extending along the same direction. It should be understood that the first device region 20 and the second device region 30 may be defined in any non-overlapping regions of the substrate 10, and the fin structure 104 and fin structure 106 may extend along the same or different directions. In other words, the line A-A' extending along respective longitudinal directions of fin structure 104 and fin structure 106 is not limited to be a contentious straight line, and may comprise a bend at the portion traversing the deep trench 110 between the first device region 20 and the second device region 30.

Substantially, a fin cut process is performed to form at least a first trench 20 in the first device region 20 thereby segmenting each fin structure 104 into at least two segments, such as segment 104a and segment 104b as shown in FIG. 1. The depth of the first trench 120 may be equal or smaller than that of the deep trench 110. According to the embodiment, the fin cut process may include forming an organic planarization layer (OPL) or an organic dielectric layer (ODL) covering the structure 100 completely and filling the deep trench 110, and provide a substantially planar top surface to facilitate a following patterning process such as a photolithography-etching process to form the first trench 120 in the first device region, traversing across each fin structures 104.

Please refer to FIG. 2. Optionally, a liner (not shown) may be formed on the surfaces of the deep trench 110 and the first trench 120 by performing, for example, a thermal oxidation process. Afterward, a first material 146 is formed blanketly covering the substrate 100 and concurrently filling the deep trench 110 and the first trench 120. A planarization process such as a chemical mechanical polishing (CMP) process or an etching back process may be carried out to remove the excess first material 146 outside the deep trench 110 and the first trench 120 until the buffer layer 134 is exposed. The top surfaces of the first materials 146 remaining in the deep trench 110 and the first trench 120 are substantially flush with the exposed buffer layer 134. The buffer layer 134 may serve as a polishing stop layer for the CMP process or an etching stop layer for the etching back process. According to an embodiment, the first material 146 is formed by flowable chemical vapor deposition (FCVD) process or any other suitable process having proper gap filling ability. Preferably, an annealing process is performed to solidify and densify the first material 146. According to the embodiment, the first material 146 comprises silicon oxide ($SiO_2$), having a first stress such as a compressive stress.

Please refer to FIG. 3. The buffer layer 134 is then removed and the pad layer 132 is exposed. The top surface of the first material 146 is at a level higher than the exposed pad layer 132. The pad layer 132 covering the substrate 100 may serve as a protection layer during the following process. Subsequently, another fin cut process is performed to form at least a second trench 130 in the second device region 30 thereby segmenting each fin structure 106 into at least two segments, such as segment 106a and segment 106b as shown in FIG. 3. According to an embodiment, the depth of the second trench 130 may be equal or smaller than that of the deep trench 110, and may be the same or different from that of the first trench 120.

Please refer to FIG. 4. Optionally, a liner (not shown) may be formed covering the surface of the second trench 130 and a second material 156 is then formed blanketly covering the substrate 100 and the first material 146 and concurrently filling the second trench 130. According to the embodiment, the second material 156 is formed by atomic layer deposition (ALD) process wherein atomic layers of the second material 156 are stacked successively to increase the thickness uniformly along the surface of the second trench 130 until the second trench 130 is filled. A seam 157 with a pre-determined width is formed in the middle of the second material layer 156 filling the second trench 130 and extends along the depth direction of the second trench 130. The width of the seam 157 may be equal or larger than 0 angstrom (Å). According to the embodiment, the second material 156 comprises silicon nitride (SiN) having a second stress such as a tensile stress.

Please refer to FIG. 5. The excess second material 156 outside the second trench 130 is removed by an etching back process until the pad layer 132 is exposed. The stress of the second material 156 may be further adjusted to a target magnitude by performing a curing process. Afterward, successive ion implantation processes are performed to form a first well 101 in the first device region 20 and a second well 102 in the second device region 30 comprising pre-determined dopant species and dosages. The depths of the first well 101 and the second well 102 may be the same or different, and preferably, are both smaller than the depth of the deep trench 110. After forming the first well 101 and the second well 102, an annealing process may be carried out to repair the crystal dislocations of the substrate 110 formed during the ion implantation processes meanwhile to activate the implanted dopants in the first well 101 and the second well 102. It is noteworthy that the curing process previously mentioned and/or the annealing process after forming the first well 101 and the second well 102 may cause the second material 156 to shrink. As shown in FIG. 5, a top portion of the second material 156 shrinks toward the seam 157 consequently becoming a top protruding portion 156' having a top surface lower than the pad layer 132 and exposing the upper sidewall and the top corner of the second trench 130. During the process of etching back the second material 156, the first material 146 filling the deep trench 110 and the first trench 120 may be etched at the same time. According to an embodiment, a top surface of the first material 146 after etching back the second material 156 is substantially flush with the pad layer 132, as shown in FIG. 5.

Please refer to FIG. 6. Subsequently, a fin recess process is performed to recess the first material 146 in the deep trench 100 and also in the first trench 120 to expose upper sidewalls of the fin structures 104 and 106. A gate dielectric layer 160 is then formed along the exposed upper sidewalls of the fin structures 104 and 106 by performing, for example, an in-situ seam generation (ISSG) process or an atomic layer deposition (ALD) process. A gate process, such as a poly gate process or a metal gate process is then performed to form the gate structures 170a, 170, 180a and 180 on the substrate 100, wherein the gate structure 170a is formed striding across the segment 104a and the segment 104b in the first device region 20, the gate structure 170 is formed atop and completely overlapping the first trench 110, the gate structure 180a is formed striding across the segment 106a and 106b in the second device region 30, and the gate structure 180 is formed atop and completely overlapping the second trench 120. Afterward, the source/drain regions 176 having the first conductive type (P-type) are formed in the segments 104a and 104b and adjacent to each side of the gate structure 170a and 170, and the source/drain regions 186 having the second conductive type (N-type) are formed in the segments 106a and 106b and adjacent to each side of the gate structure 180a and 180, thereby P-type fin FETs and N-type fin FETs of the CMOS device are obtained respectively in the first device region 20 and the second device region 30. As shown in FIG. 6, the gate structure 170 is formed directly atop the first material 146 and filling into a top portion of the first trench 120, and the gate structure 180 is formed directly atop the second material 156 and filling into a top portion of the second trench 130. The first trench 120 and the first material 146 constitute a first isolation structure in the fin structure 104 to electrically separate the P-type fin FETs formed on the segment 104a and the segment 104b. Similarly, the second trench 130 and the second material 156 constitute a second isolation structure in the fin structure 106 to electrically separate the N-type fin FETs formed respectively on the segment 106a and the segment 106b. The deep trench 110 defining the first device region 20, the second device region 30, the fin structures 104 and the fin structures 106, and the first material 146 filled in the deep trench 110 constitute a third isolation structure, electrically isolating the first device region 20 and the second device region 30, and isolating each fin structure 104 and fin structure 106. The gate structure 170 and gate structure 180 may be considered as dummy gates wherein the areas overlapped by gate structure 170 and gate structure 180 are not channel regions. The gate structure 170 is formed to prevent the undesired epitaxial bridge between the adjacent distal ends of the segments 104a and 104b at the two sides of the first trench 120, and to prevent possible facet defects formed in the source/drain regions 176 adjacent to the first trench 120. Similarly, the gate structure 180 is formed to prevent the undesired epitaxial bridge between the adjacent distal ends of the segments 106a and 106b at the two sides of the second trench 130, and to prevent possible facet defects formed in the source/drain regions 186 adjacent to the second trench 130. The first isolation structure segmenting the fin structures 104 and the gate structure 170 disposed thereon form a first single diffusion break (SDB), and the second isolation structure segmenting the fin structures 106 and the gate structure 180 disposed thereon form a second SDB. It should be understood that for the sake of simplicity, only gate structures 170a, 170, 180a and 180 are shown in FIG. 6 with their gate electrodes 172a, 172, 182a, 182 and spacers 174a, 174, 184a, 184. The gate electrodes 172a, 172, 182a and 182 may comprise poly silicon or work-function metal wherein a high-k dielectric layer (not shown) having liner or U-shaped cross-sectional profile may be formed between the work-function metal and the substrate 100. It is noteworthy that an interlayer dielectric layer 190 is further formed on the substrate 100, completely covering the gate structures 170a, 170, 180a and 180, the first isolation structure, the second isolation structure and the third isolation structure. The interlayer dielectric layer 190 is formed to intermediate between the substrate 100 and the devices formed thereon and the interconnecting metal. The dielectric layer 190 is usually planarized to provide a planar top surface to facilitate the process of forming the interconnecting metal structure.

One feature of the present invention is that the first trench 120 segmenting the fin structures 104 in the first device region 20 and the second trench 130 segmenting the fin structures 106 in the second device region 30 are filled with the first material 146 and the second material 156 comprising different stresses respectively. Therefore, fin FETs formed in either the first device region 20 or the second device region 30 may be differently stressed by a particular type of stress according to their conductivities, especially on a direction traverse the channel direction of the fin FETs. In this way, the purpose of improving the performance of the complementary devices at the same time may be achieved.

Figure 7:
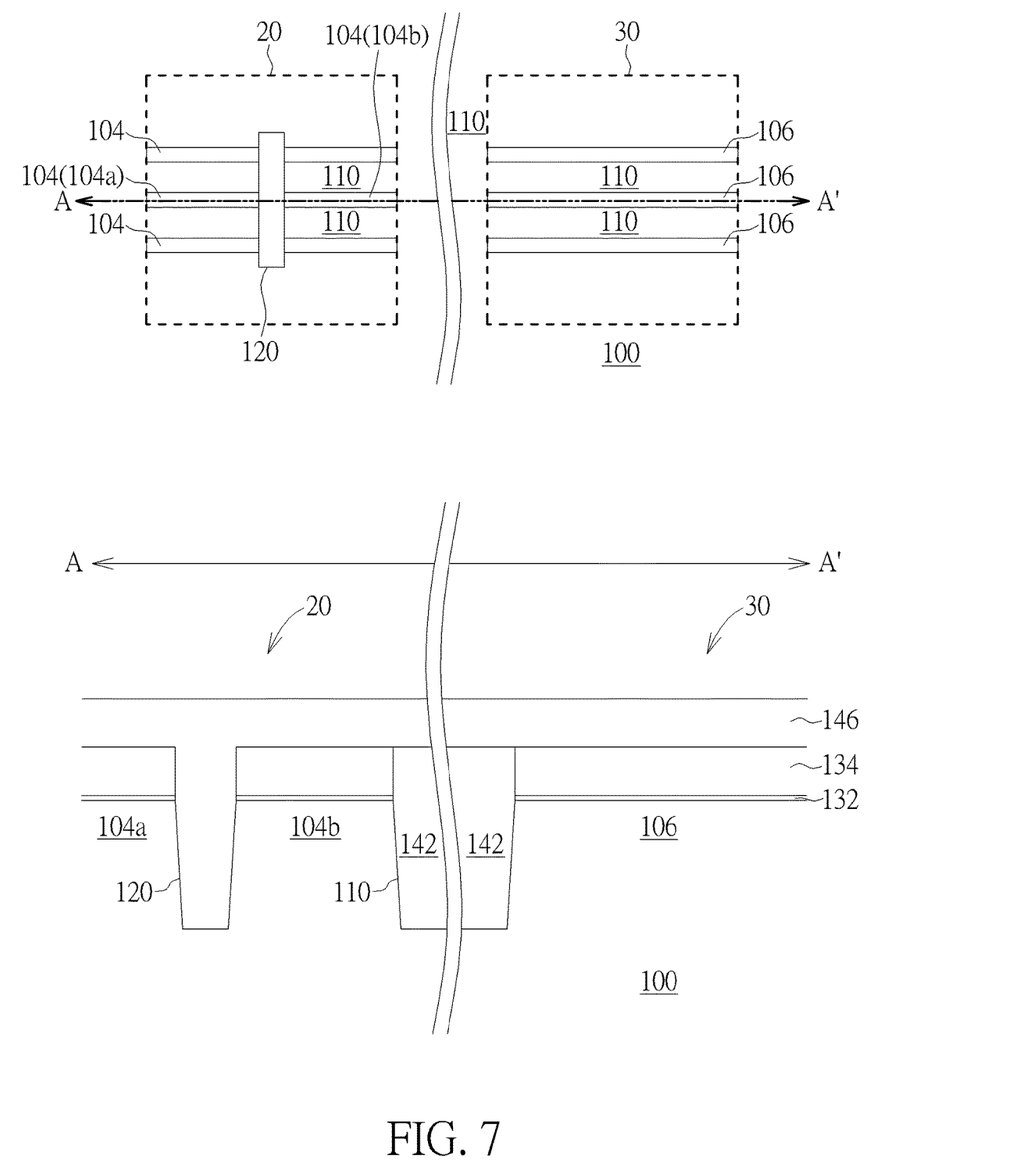
FIG. 7 and FIG. 8 are schematic diagrams illustrating the steps of fabricating a CMOS device according to a second embodiment of the present invention. The upper portion of FIG. 7 is a top view, and the lower portion of FIG. 7 is a cross-sectional view taken along line A-A' as in the top view.
Figure 8:
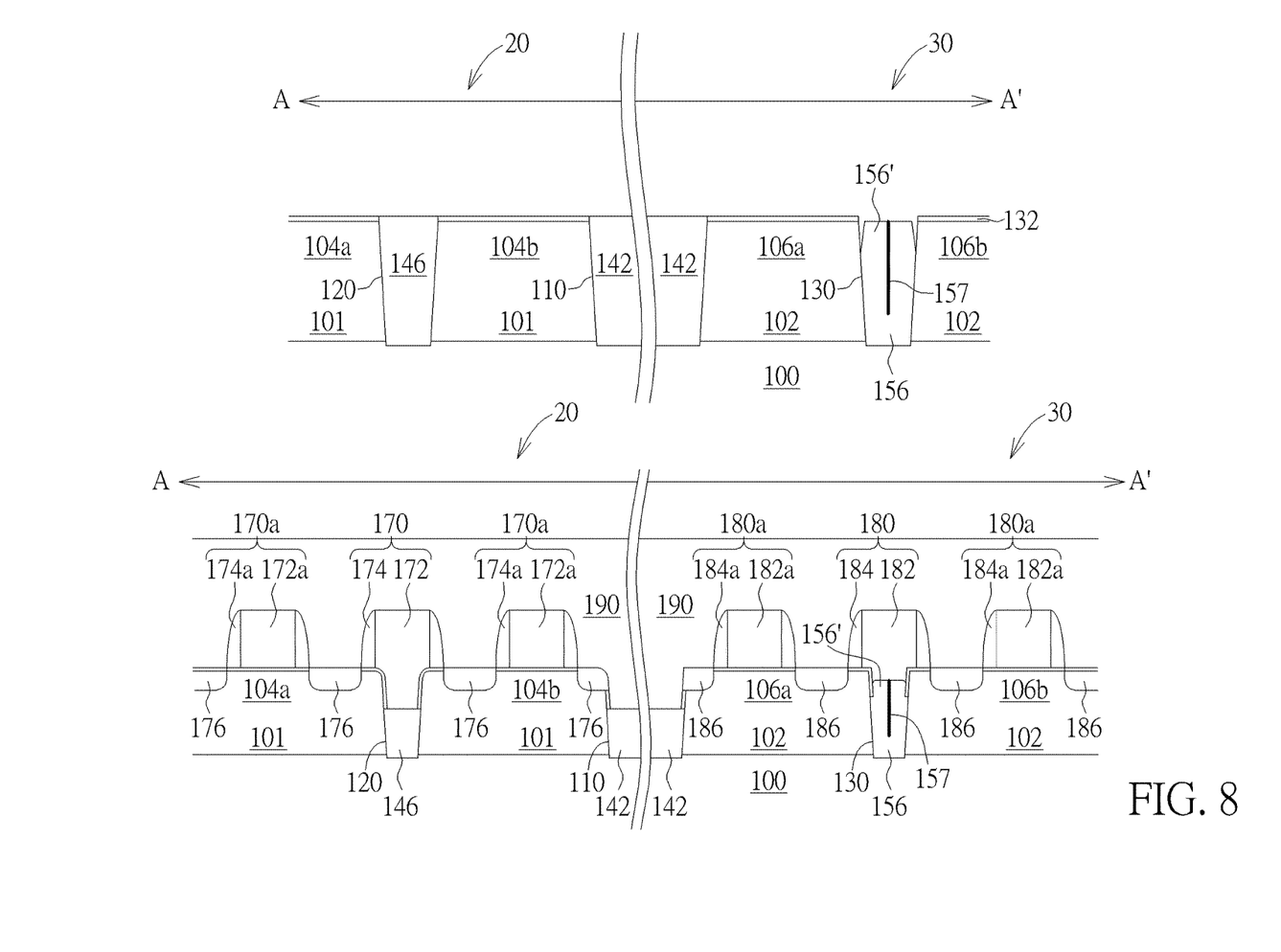

FIG. 7 and FIG. 8 are schematic diagrams illustrating the steps of fabricating a CMOS device according to a second embodiment of the present invention. The upper portion of FIG. 7 is a top view and the lower portion of FIG. 7 is a cross-sectional view taken along line A-A' in the top view. Some reference numbers referring to elements shown in the cross-sectional views are not shown in the top view for the sake of simplicity. Similarly, the first device region 20 and the second device region 30 may be defined in any non-overlapping regions of the substrate 100; the fin structures 104 and the fin structures 106 may extend along the same or different directions. The line A-A' shown in the top view is not limited to be a contentious straight line and may comprise at the portion traversing the deep trench 110 between the first device region 20 and the second device region 30. The difference between the first embodiment and the second embodiment is that, in the second embodiment, a third material 142 is formed to fill the deep trench 110 before forming the first trench 120.

Please refer to FIG. 7. Similarly a substrate 100 is provided with a pad layer 132 and a buffer layer 134 formed thereon. A deep trench 110 is formed in the substrate 100 to define at least a first device region 20 comprising a plurality of parallel-arranged fin structures 104 also defined by the deep trench 110, and at least a second device region 30 comprising a plurality of parallel-arranged fin structures 106 also defined by the deep trench 110. Optionally, a liner (not shown) may be formed on the surface of the deep trench 110, and a third material 142 is then formed blanketly covering the substrate 100 and filling the deep trench 110. According to an embodiment, the third material 142 is formed by performing a FCVD process or any other suitable process having proper gap filling ability. According to the embodiment, the third material 142 is made of silicon oxide and has a third stress. A planarization process such as a CMP process or an etching back process is performed to remove the excess third material 142 outside the deep trench 110 until the buffer layer 134 is exposed. After the planarization process, a top surface of the remaining third material 142 in the deep trench 110 is substantially flush with the exposed buffer layer 134. Subsequently, a fin cut process is performed to form at least a first trench 120 in the first device region 20 thereby segmenting each fin structure 104 into at least two segments, such as segment 104a and segment 104b as shown in FIG. 7. It is noteworthy that in the second embodiment, there is no need to form an OPL or an ODL on the substrate 100 when performing the fin cut process because that the deep trench 110 has already been filled with the third material 142 and the substrate 100 has been planarized.

Still refer to FIG. 7. Similarly, a liner (not shown) may be formed on the surface of the first trench 120 and then a first material 146 is formed blanketly covering the substrate 100 and the third material 142 and filling the first trench 120. According to the embodiment, the first material 146 is formed by a FCVD process. The first material 146 is made of silicon oxide having a first stress, such as a compressive stress.

Please refer to the upper portion of FIG. 8. Subsequently, the excess first material 146 outside the first trench 120 is removed by performing a planarization process until the buffer layer 134 is exposed. The buffer layer 134 is then removed and the liner 132 is exposed. The liner may serve as a protection layer for the substrate 100 during the following process. After that, another fin cut process is performed to form at least a second trench 130 in the second device region 30 thereby segmenting each fin structure 106 into at least two segments, such as segment 106a and segment 106b as shown in FIG. 8. A second material 156 is then formed blanketly covering the substrate 110, the third material 142 and the first material 146 and filling the second trench 130, and the excess second material 156 outside the second trench 130 is removed by performing an etching back process until the liner 132 is exposed. After that, similar processes as illustrated in the first embodiment are performed, including performing successive ion implantation processes to form the first well 101 and the second well 102 in the first device region 20 and the second device region 30 respectively, and performing an annealing process to repair the crystal dislocation in the substrate 100 and to activate the implanted dopants. Preferably, the second material 156 is made of silicon nitride having a second stress, such as a tensile stress. According to the embodiment, the second material 156 is formed by performing an ALD process and a seam 157 may be formed in the middle of the second material 156, extending along the depth direction of the second trench 130. A curing process may be performed optionally after the second material 156 being etched back to further adjusting the stress of the second material 156 to meet a target magnitude. The annealing process and/or the curing process aforesaid may cause the second material 156 to shrink. A top portion of the second material 156 may shrink toward the seam 157 consequently forming a top protruding portion 156' having a top surface lower than the remaining pad layer 132, and the upper sidewall and the top corner of the second trench 130 are exposed, as shown in FIG. 8.

Please refer to the lower portion of FIG. 8. Afterward, processes similar to the first embodiment are carried out, including performing a fin recess process and forming a gate dielectric layer 160 on the exposed surfaces of the fin structures 104 and 106. A gate process, such as a poly gate process or a metal gate process is then performed to form the gate structures 170a, 170, 180a and 180 on the substrate 100, wherein the gate structure 170a is formed striding across the segment 104a and the segment 104b in the first device region 20, the gate structure 170 is formed atop and completely overlapping the first trench 110, the gate structure 180a is formed striding across the segment 106a and 106b in the second device region 30, and the gate structure 180 is formed atop and completely overlapping the second trench 120. Afterward, the source/drain regions 176 having the first conductive type (P-type) are formed in the segments 104a and 104b and adjacent to each side of the gate structure 170a and 170, and the source/drain regions 186 having the second conductive type (N-type) are formed in the segments 106a and 106b and adjacent to each side of the gate structure 180a and 180, thereby P-type fin FETs and N-type fin FETs of the CMOS device are obtained respectively in the first device region 20 and the second device region 30.

One feature of the second embodiment is that, the third material 142 with the third stress may also have influence regarding to the overall stress received by the fin FETs formed in the first device region 20 and the second device region 30, especially on a direction parallel to the channel direction of the fin FETs. In some cases, a third material 142 comprising small stress or even having no stress for the devices may be used to substantially provide a minimum influence for each type of devices.

Figure 9:
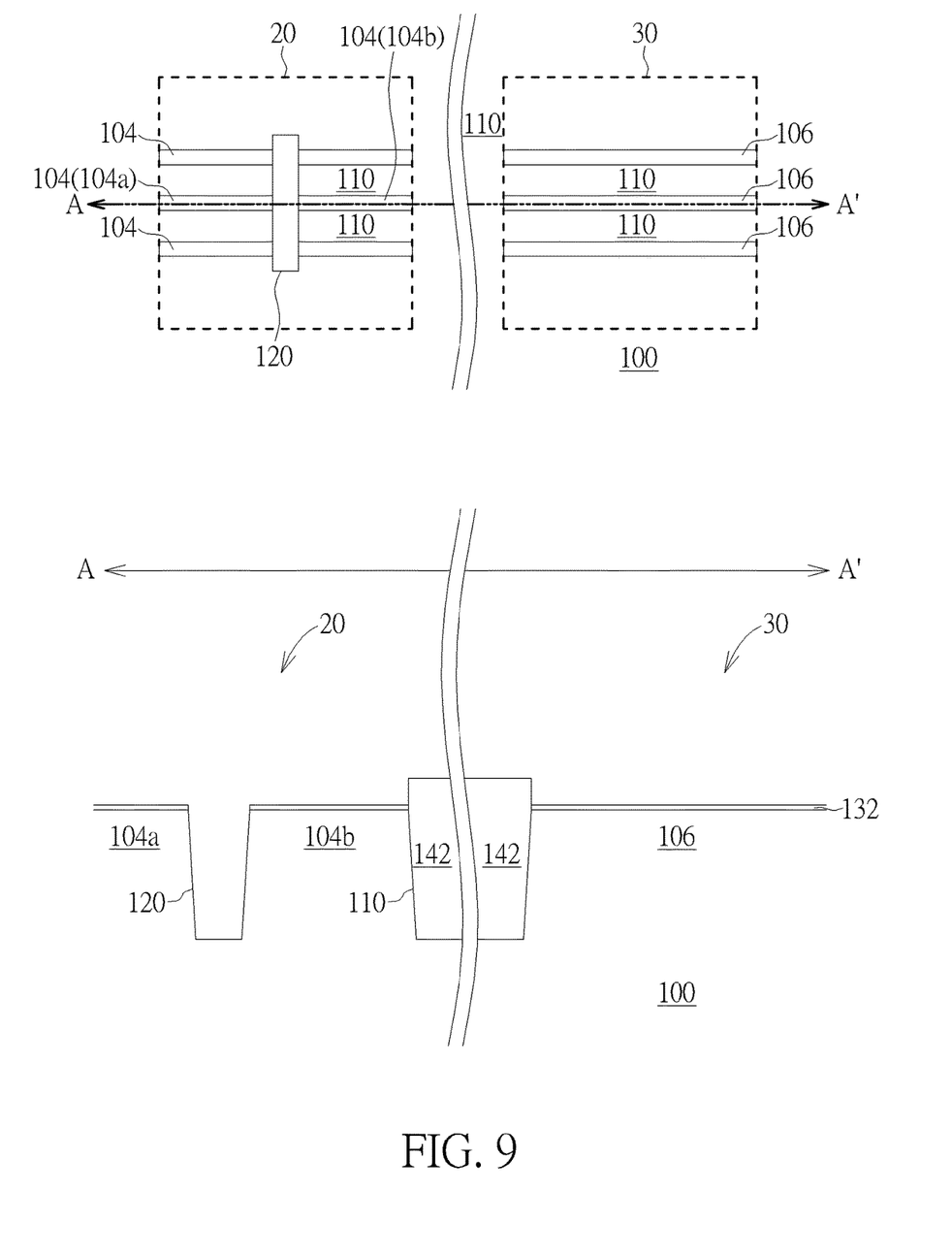
FIG. 9 to FIG. 14 are schematic diagrams illustrating the steps of fabricating a CMOS device according to a third embodiment of the present invention.
Figure 10:
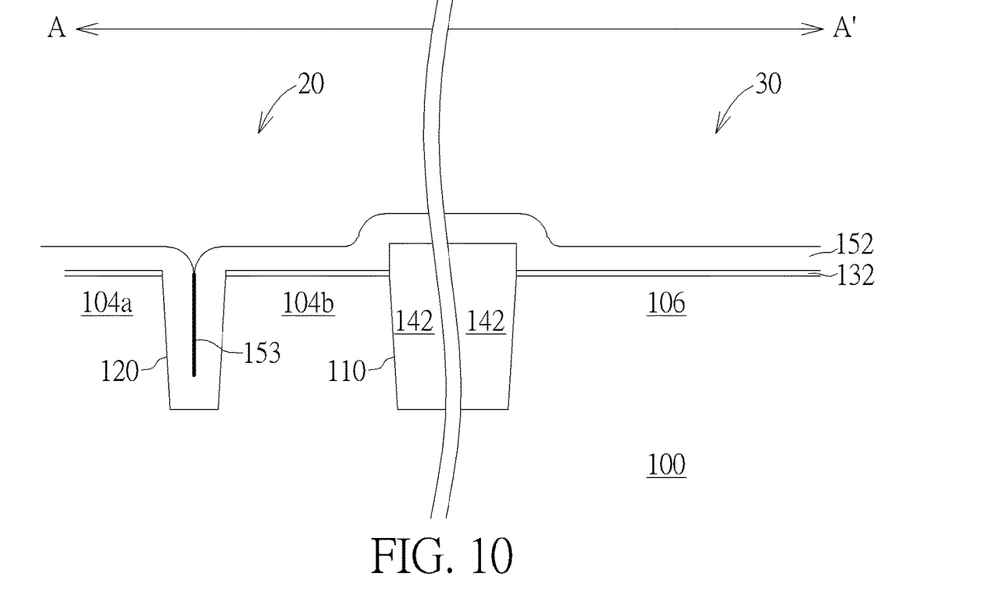
Figure 11:
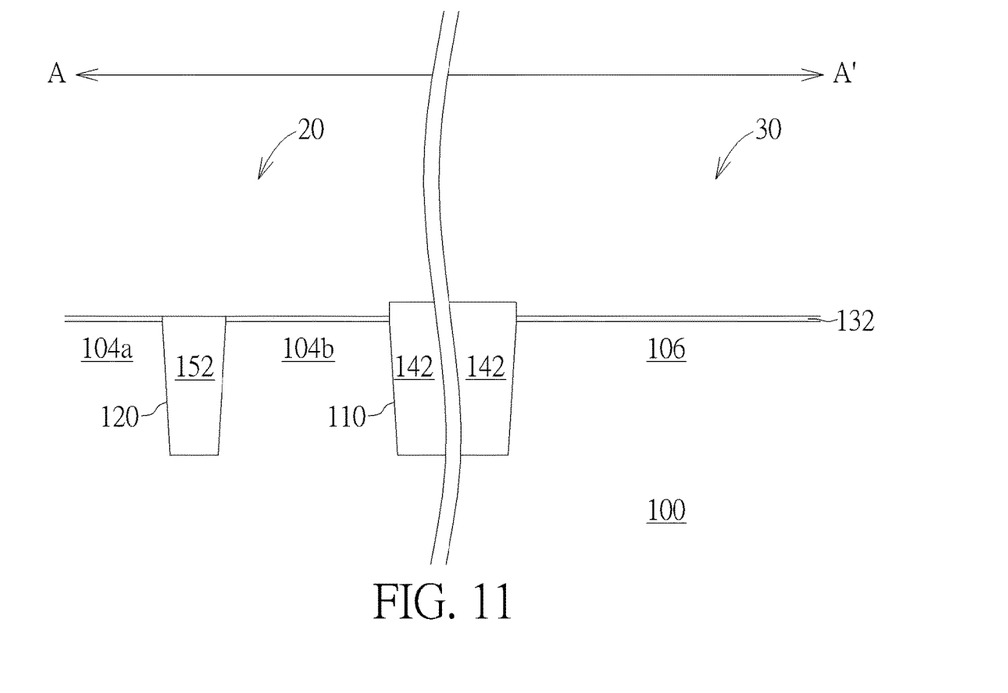
Figure 12:
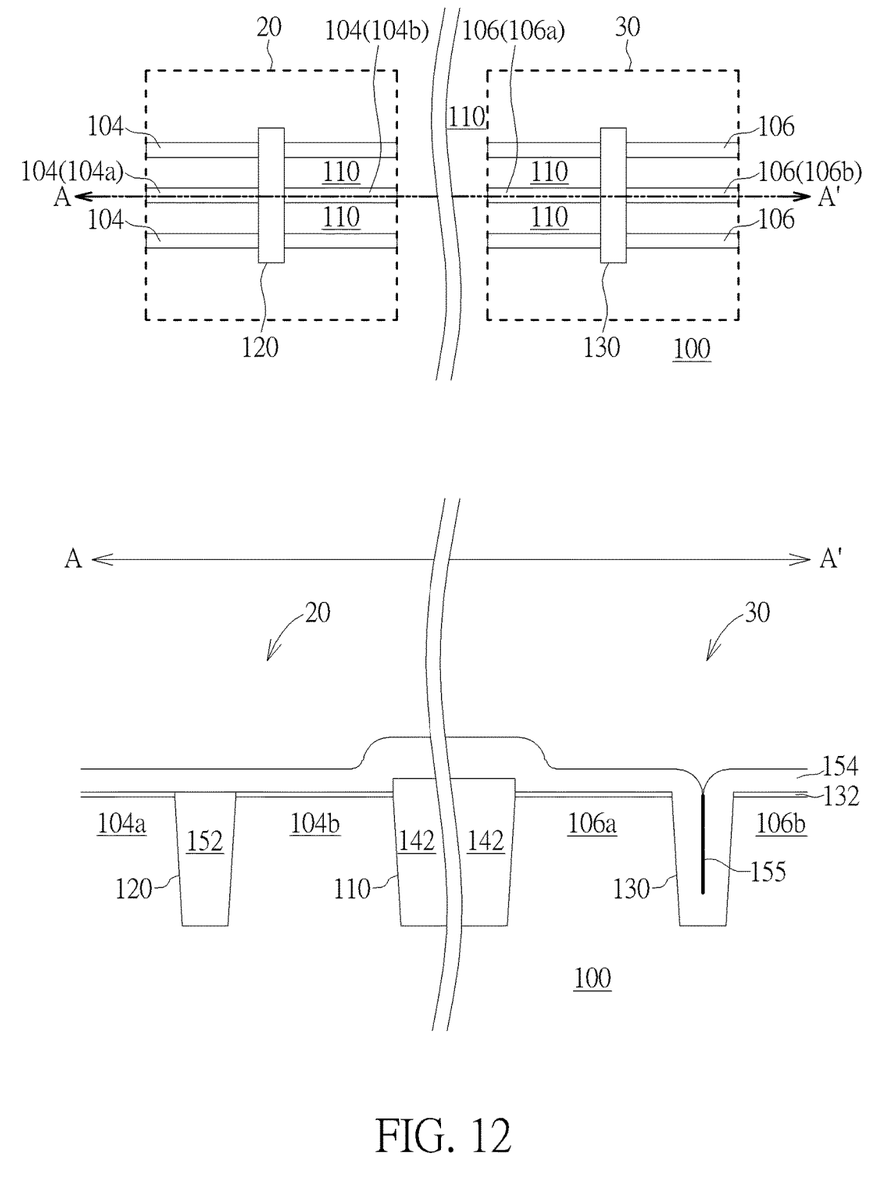
Figure 13:
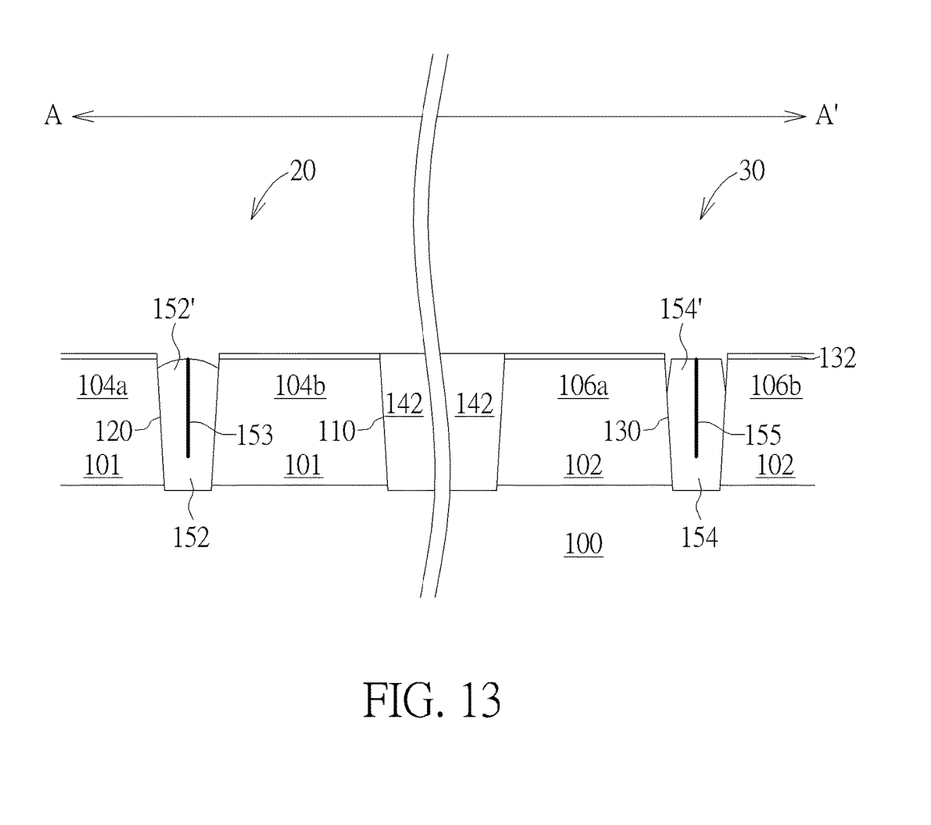
Figure 14:
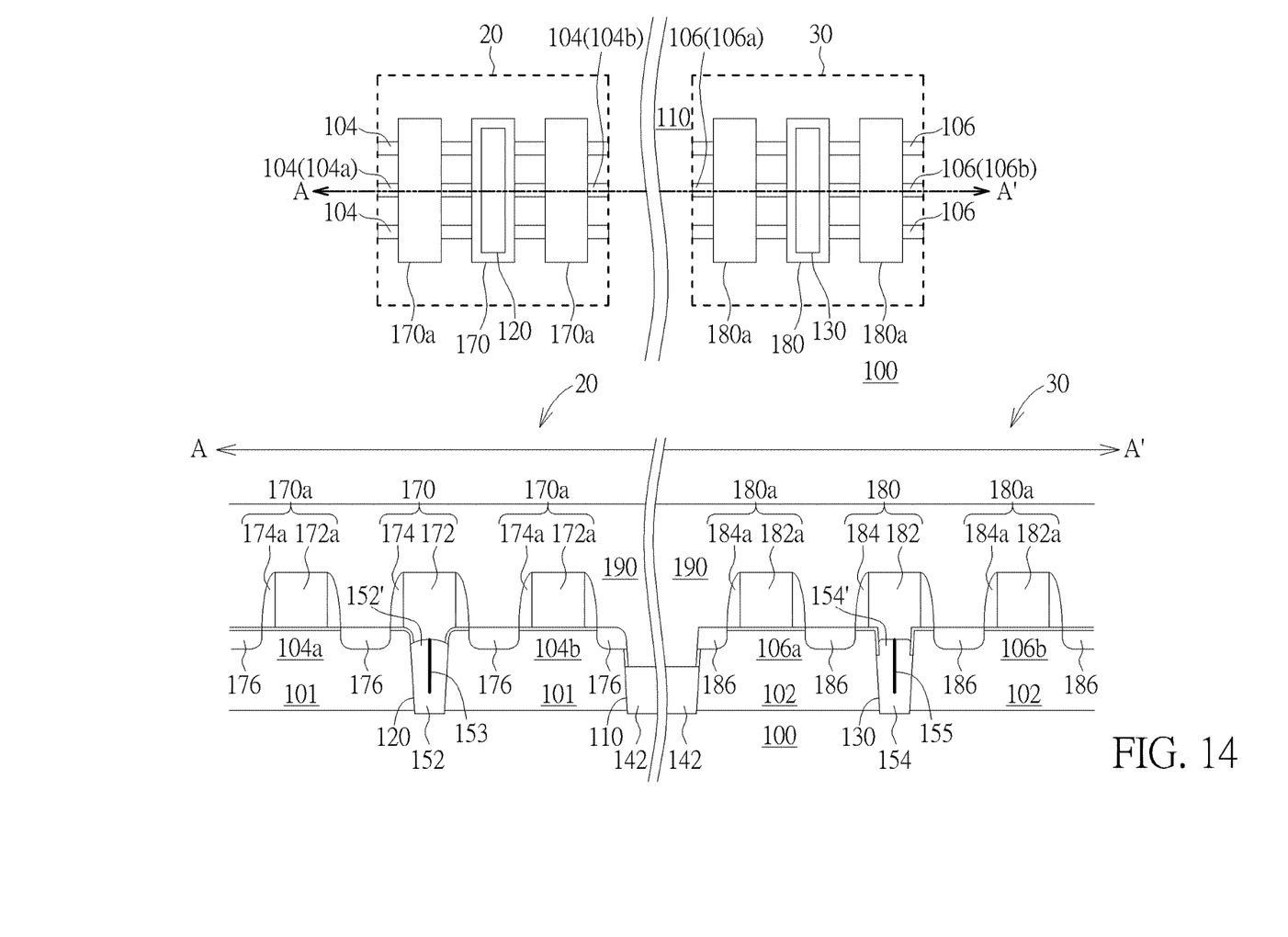

FIG. 9 to FIG. 14 are schematic diagrams illustrating the steps of fabricating a CMOS device according to a third embodiment of the present invention. In FIG. 9, FIG. 12, and FIG. 14, the upper portion is a top view and the lower portion is a cross-sectional view taken along line A-A' in the top view. Some reference numbers referring to elements shown in the cross-sectional views are not shown in the top view for the sake of simplicity. Similarly, the first device region 20 and the second device region 30 may be defined in any non-overlapping regions of the substrate 100; the fin structures 104 and the fin structures 106 may extend along the same or different directions. The line A-A' shown in the top view is not limited to be a contentious straight line and may comprise at the portion traversing the deep trench 110 between the first device region 20 and the second device region 30. The third embodiment differs from the first embodiment and the second embodiment in the aspect that the first material 152 and the second material 154 filling the first trench 120 and the second trench 130 are made of the same material but comprise different stresses. For example, the first material 152 filling the first trench 120 is made of silicon nitride and has a compressive stress; the second material 154 filling in the second trench 130 is also made of silicon nitride but comprising a tensile stress. In the following description, the first trench 120 and the first material 152 filled therein are formed in the first device region 20 firstly followed by forming the second trench 130 and the second material 154 filled therein. However, it should be understood that in other embodiments, the sequence of forming the first trench 120, the first material 152 and forming the second trench 130, the second material 154 may be exchanged.

Please refer to FIG. 9. Similarly, a substrate 100 is provided. A pad layer 132 and a buffer layer (not shown) may be formed on the substrate 100. A deep trench 110 is formed in the substrate 100 to define at least a first device region 20 comprising a plurality of parallel-arranged fin structures 104 and at least a second device region 30 comprising a plurality of parallel-arranged fin structures 106. The deep trench 110 is filled with a third material 142. The third material 142 may be a silicon oxide layer comprising a third stress and is formed by a FCVD process. The method of forming the third material 142 may include forming the third material 142 blanketly covering the substrate 100 and filling the deep trench 100 and performing a planarization process to remove the excess third material 142 outside the deep trench 110, exposing the underneath buffer layer. The buffer layer is then removed to expose the pad layer 132 and the top surface of the third material 142 is at a level higher than the pad layer 132, as shown in FIG. 9.

Subsequently, a fin cut process is performed to form at least a first trench 120 in the first device region 20 thereby segmenting each fin structure 104 into at least two segments, such as segment 104a and segment 104b as shown in FIG. 9.

Please refer to FIG. 10. A liner (not shown) may be formed on the surface of the first trench 120, and then the first material 152 such as silicon nitride is formed blanketly covering the substrate 100 and the third material 142 and filling the first trench 120. The first material 152 comprises a first stress, such as a compressive stress. The first material 152 may be formed preferably by an ALD process. A seam 153 is formed in the middle of the first material 152, extending along the depth direction of the first trench 120.

Please refer to FIG. 11. An etching back process is then performed to remove the excess first material 152 outside the first trench 120 until the pad layer 132 is exposed. According to the embodiment, the top surface of the third 142 filled in the deep trench 110 may also be etched to a lower level during the etching back process, but still at a level higher than the pad layer 132.

Please refer to FIG. 12. Afterward, another fin cut process is performed to form at least a second trench 130 in the second device region 30 thereby segmenting each fin structure 106 into at least two segments, such as segment 106a and segment 106b as shown in FIG. 12. A liner (not shown) may be formed on the surface of the second trench 130 and a second material 154 also made of silicon nitride is formed also by ALD process, blanketly covering the substrate 100, the third material 142, the first material 142 and filling the second trench 120. The second material 154 comprises a second stress, such as a tensile stress. A seam 155 is formed in the middle of the second material 154, extending along the depth direction of the second trench 130. By adjusting the ALD process parameters such as the hydrogen to oxygen ratio, the ratio of the components comprised in the first material 152 and second material 154 may be different; therefore different stresses may be obtained.

Please refer to FIG. 13. The excess second material 154 outside the second trench 130 is then removed by performing an etching back process until the pad layer 132 is exposed again. It is noteworthy that a cuing process may be carried out after removing the excess second material 154 to further adjust the stress. Similarly, successive ion implantation processes may be carried out to form the first well 101 in the first device region 20 and the second well 102 in the second device region 30. An annealing process may be carried out to repair the crystal dislocation in the substrate 100 and to activate the implanted dopants. The curing process and the annealing process aforesaid may cause both the first material 152 and the second material 154 to shrink toward the seam 153 or the seam 155, therefore forming a top protruding portion 152' and a top protruding portion 154' respectively and exposing the upper surfaces and the top corners of the first trench 120 and the second trench 130. It should be noticed that the stresses and the ratio of constituting components such as hydrogen of the first material 152 and the second material 154 are different and may cause different degrees of shrinkage. As shown in FIG. 13, the top protruding portion 154' of the second material 154 substantially has a more tapered cross-sectional profile than that of the top protruding portion 152' of the first material. When removing the excess second material 154, the third material 142 filling the deep trench 110 may further be etched again to a lower level, and preferably flush with the pad layer 132.

Please refer to FIG. 14. Afterward, processes similar to the first embodiment and the second embodiment may be carried out to form the structure as shown in FIG. 14, including performing a fin recess process and forming agate dielectric layer 160 on the exposed surfaces of the fin structures 104 and 106. A gate process, such as a poly gate process or a metal gate process is then performed to form the gate structures 170a, 170, 180a and 180 on the substrate 100, wherein the gate structure 170a is formed striding across the segment 104a and the segment 104b in the first device region 20, the gate structure 170 is formed atop and completely overlapping the first trench 110, the gate structure 180a is formed striding across the segment 106a and 106b in the second device region 30, and the gate structure 180 is formed atop and completely overlapping the second trench 120. Afterward, the source/drain regions 176 having the first conductive type (P-type) are formed in the segments 104a and 104b and adjacent to each side of the gate structure 170a and 170, and the source/drain regions 186 having the second conductive type (N-type) are formed in the segments 106a and 106b and adjacent to each side of the gate structure 180a and 180, thereby P-type fin FETs and N-type fin FETs of the CMOS device are obtained respectively in the first device region 20 and the second device region 30. One feature of the third embodiment is that, the stresses comprised in the first material 152 and the second material 154 may be conveniently adjusted by simply adjusting their respective deposition parameters to meet their required targets. Furthermore, since the first material 152 and the second material 154 are both silicon nitride, over-etching of the first material 152 and the second material 154 when performing the fin recess process may be prevented, and improper-isolations between segments 104a and 104b and between segments 106a and 106b caused therefrom may be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a complementary metal oxide semiconductor device, comprising:
   forming a deep trench in a substrate to define a first fin structure and a second fin structure in the substrate;
   forming a first trench cutting through the first fin structure and forming a first material filling the deep trench and the first trench;
   forming a second trench cutting through the second fin structure and forming a second material filling the second trench, wherein the first material and the second material comprise different stresses; and
   forming a first gate structure and a second gate structure disposed atop the first material and the second material respectively, wherein the first gate structure completely covers the first trench and the second gate structure completely covers the second trench.

2. The method according to claim 1, wherein the first material comprises compressive stress.

3. The method according to claim 1, wherein the second material comprises tensile stress.

4. The method according to claim 3, further comprising performing a curing process after forming the second material.

5. The method according to claim 1, further comprising performing a chemical mechanical polishing process to remove the first material outside the deep trench and the first trench.

6. The method according to claim 1, wherein the first material comprise silicon oxide and the second material comprises silicon nitride.

* * * * *